United States Patent
Kim et al.

(10) Patent No.: US 8,748,218 B2
(45) Date of Patent: Jun. 10, 2014

(54) SOLAR CELL

(75) Inventors: Sungjin Kim, Seoul (KR); Youngsung Yang, Seoul (KR); Taeyoung Kwon, Seoul (KR); Seongeun Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 417 days.

(21) Appl. No.: 13/082,197

(22) Filed: Apr. 7, 2011

(65) Prior Publication Data

US 2012/0037219 A1     Feb. 16, 2012

(30) Foreign Application Priority Data

Aug. 13, 2010 (KR) .................. 10-2010-0078312

(51) Int. Cl.
*H01L 31/0224* (2006.01)
*H01L 31/068* (2012.01)

(52) U.S. Cl.
CPC ... *H01L 31/022425* (2013.01); *H01L 31/022433* (2013.01); *H01L 31/068* (2013.01)
USPC .................. 438/98; 438/73; 257/E31.124

(58) Field of Classification Search
CPC ............... H01L 31/022425; H01L 31/022433; H01L 31/068
USPC ................. 438/72, 73, 660, 98; 257/E31.124
See application file for complete search history.

(56) References Cited

U.S. PATENT DOCUMENTS

| | | | | |
|---|---|---|---|---|
| 5,174,925 A | * | 12/1992 | Fujii et al. | 252/514 |
| 5,928,438 A | * | 7/1999 | Salami et al. | 136/255 |
| 6,152,033 A | * | 11/2000 | Eid et al. | 101/170 |
| 2010/0018577 A1 | * | 1/2010 | Nishiwaki et al. | 136/256 |
| 2010/0132792 A1 | | 6/2010 | Kim et al. | |
| 2010/0170568 A1 | * | 7/2010 | Kawaguchi | 136/256 |

FOREIGN PATENT DOCUMENTS

| KR | 10-2010-0011945 A | 2/2010 |
|---|---|---|
| KR | 10-2010-0056114 A | 5/2010 |

* cited by examiner

*Primary Examiner* — Michael Trinh
(74) *Attorney, Agent, or Firm* — Birch, Stewart, Kolasch & Birch, LLP

(57) ABSTRACT

A solar cell and a method for manufacturing the same are discussed. The solar cell includes a substrate of a first conductive type, an emitter layer of a second conductive type opposite the first conductive type, a plurality of first electrodes each including a first electrode layer connected to the emitter layer and a second electrode layer positioned on the first electrode layer, at least one first current collector connected to the plurality of first electrodes, and a second electrode connected to the substrate. The emitter layer forms a p-n junction along with the substrate. The first electrode layer has a first width and the second electrode layer has a second width less than the first width of the first electrode layer.

10 Claims, 10 Drawing Sheets

SOLAR CELL

This application claims priority to and the benefit of Korean Patent Application No. 10-2010-0078312 filed in the Korean Intellectual Property Office on Aug. 13, 2010, the entire contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts that have different conductive types, such as a p-type and an n-type, and form a p-n junction, and electrodes respectively connected to the semiconductor parts of the different conductive types.

When light is incident on the solar cell, a plurality of electron-hole pairs are generated in the semiconductor parts. The electron-hole pairs are separated into electrons and holes by the photovoltaic effect. Thus, the separated electrons move to the n-type semiconductor part and the separated holes move to the p-type semiconductor part, and then the electrons and holes are collected by the electrodes electrically connected to the n-type semiconductor part and the p-type semiconductor part, respectively. The electrodes are connected to each other using electric wires to thereby obtain electric power.

SUMMARY OF THE INVENTION

In one aspect, there is a solar cell including a substrate of a first conductive type, an emitter layer of a second conductive type opposite the first conductive type, the emitter layer configured to form a p-n junction along with the substrate, a plurality of first electrodes each including a first electrode layer connected to the emitter layer and a second electrode layer positioned on the first electrode layer, the first electrode layer having a first width and the second electrode layer having a second width less than the first width of the first electrode layer, at least one first current collector connected to the plurality of first electrodes, and a second electrode connected to the substrate.

The first electrode layer and the at least one first current collector may contain the same material, for example, silver (Ag). The second electrode layer may contain a material different from the first electrode layer and the at least one first current collector. For example, the second electrode layer may contain at least one selected from the group consisting of nickel (Ni), copper (Cu), aluminum (Al), tin (Sn), zinc (Zn), indium (In), titanium (Ti), gold (Au), and a combination thereof as a main component.

Alternatively, the first electrode layer, the second electrode layer, and the at least one first current collector may contain silver (Ag). A silver content of the first electrode layer and a silver content of the at least one first current collector may be greater than a silver content of the second electrode layer.

The second electrode layer may be formed even on the at least one first current collector.

The first width of the first electrode layer may be approximately 30 μm to 100 μm. The second width of the second electrode layer may be approximately 25 μm to 45 μm. A thickness of the first electrode layer may be approximately 10 μm to 35 μm. A thickness of the second electrode layer may be approximately 3 μm to 15 μm.

In another aspect, there is a method for manufacturing an electrode of a solar cell including printing a first front electrode part paste on a first region of a semiconductor substrate using a screen printing method to form a first front electrode part pattern, and printing a second front electrode part ink on at least a portion of the first front electrode part pattern using a roll printing method to form a second front electrode part pattern.

The forming of the first front electrode part pattern may include simultaneously forming a first electrode layer pattern in a first direction and a first current collector pattern in a second direction crossing the first direction.

The forming of the second front electrode part pattern may include printing the second front electrode part ink on the first electrode layer pattern to form a second electrode layer pattern right on the first electrode layer pattern in the first direction. In this instance, a width of the second electrode layer pattern may be less than a width of the first electrode layer pattern.

The forming of the second front electrode part pattern may include printing the second front electrode part ink on the first electrode layer pattern and the first current collector pattern to form a second electrode layer pattern having the same plane shape as the first front electrode part pattern. In this instance, a width of the second electrode layer pattern may be less than a width of the first electrode layer pattern and a width of the first current collector pattern.

The forming of the second front electrode part pattern may include filling the second front electrode part ink in a groove of an intaglio printing plate corresponding to a formation location of the second front electrode part pattern to be formed, and bringing the intaglio printing plate having a roll shape into contact with the at least a portion of the first front electrode part pattern on the semiconductor substrate and rotating the intaglio printing plate to transfer the second front electrode part ink filled in the groove of the intaglio printing plate to the at least a portion of the first front electrode part pattern on a surface of the semiconductor substrate.

The forming of the second front electrode part pattern may include filling the second front electrode part ink in a groove of an intaglio printing plate corresponding to a formation location of the second front electrode part pattern to be formed, bringing the intaglio printing plate into contact with a roll-shaped blanket and rotating the intaglio printing plate to transfer the second front electrode part ink filled in the groove of the intaglio printing plate to a surface of the roll-shaped blanket, and bringing the blanket into contact with the at least a portion of the first front electrode part pattern on the semiconductor substrate and rotating the blanket to again transfer the second front electrode part ink transferred to the blanket to the at least a portion of the first front electrode part pattern on a surface of the semiconductor substrate.

According to the above-described characteristics, because each of the plurality of first electrodes has a double-layered structure including the first electrode layer and the second electrode layer, the thickness of the first electrode having the double-layered structure is greater than a thickness of a first electrode having a single-layered structure. Thus, a serial resistance of the first electrode is reduced, and a carrier transfer efficiency from the emitter layer to the plurality of first electrodes is improved. As a result, the efficiency of the solar cell is improved.

Further, because a portion of the first electrode contacting the emitter layer contains silver, a contact resistance between the emitter layer and the first electrode is reduced. Hence, the carrier transfer efficiency from the emitter layer to the first electrodes is improved. As a result, the efficiency of the solar cell is improved.

Further, because the second electrode layer is formed using a conductive material that is more inexpensive than silver, an amount of silver paste used decreases. Thus, the manufacturing cost of the solar cell is reduced.

The electrode manufacturing method may further comprise, before forming the second front electrode part pattern, drying the first front electrode part pattern. Further, the electrode manufacturing method may further comprise simultaneously firing the first front electrode part pattern and the second front electrode part pattern.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
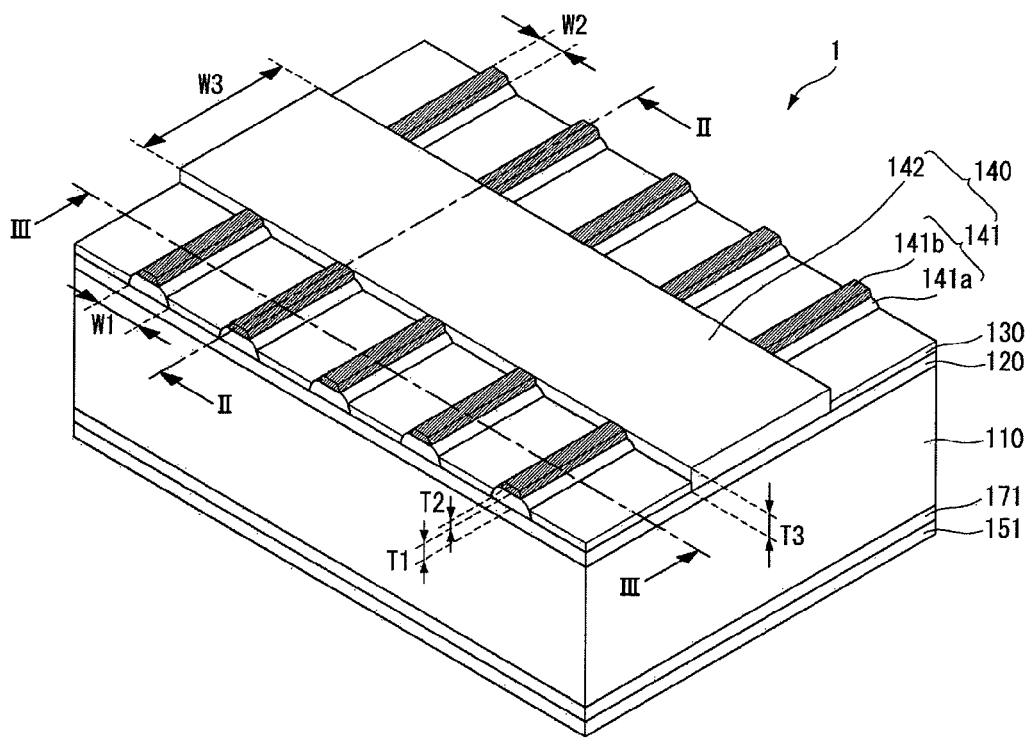
FIG. 1 is a partial perspective view of a solar cell according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 2:
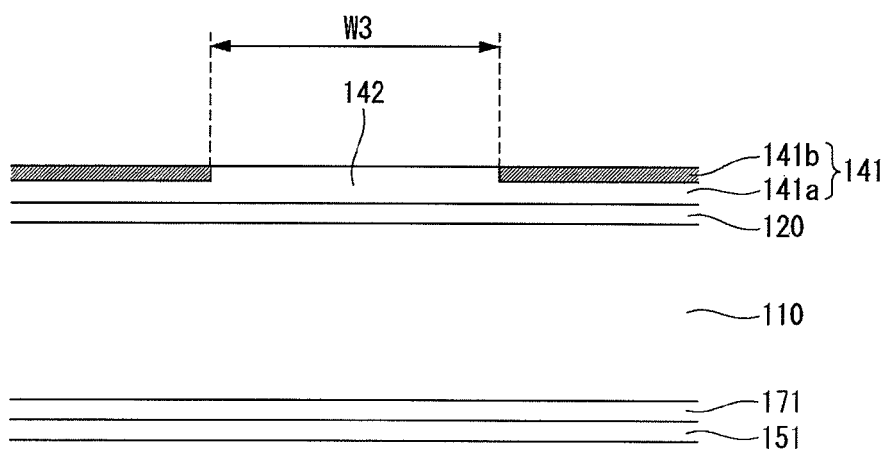
FIG. 2 is a cross-sectional view taken along line II-II of FIG. 1.
Figure 3:
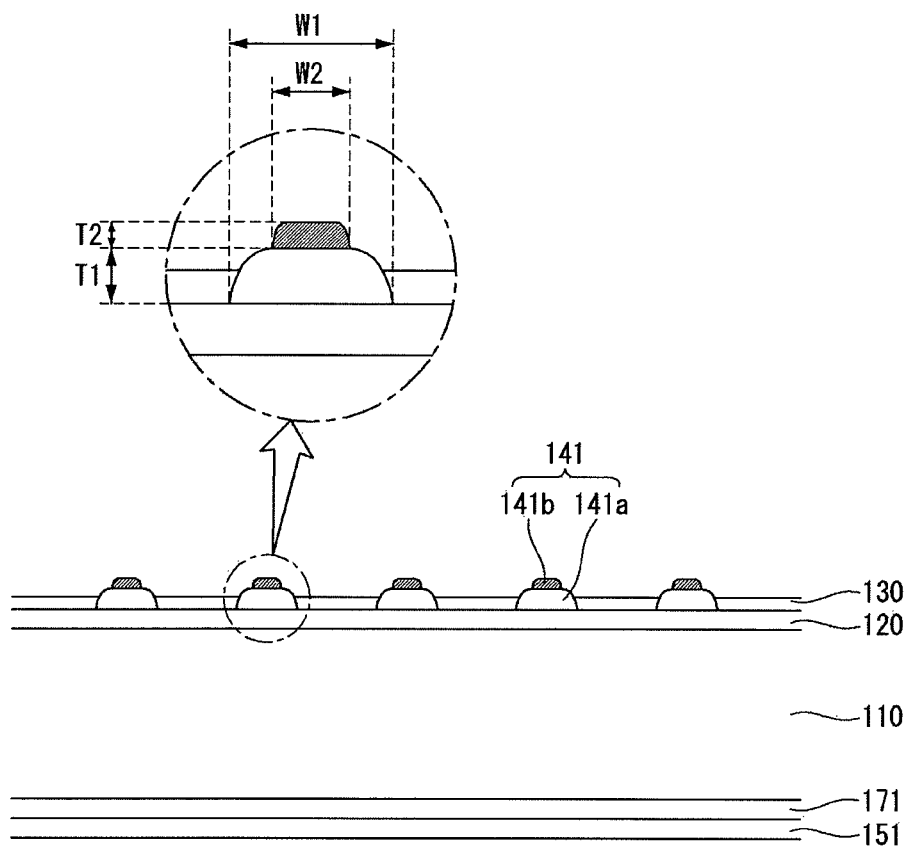
FIG. 3 is a cross-sectional view taken along line III-III of FIG. 1.

FIG. 1 is a partial perspective view of a solar cell according to an example embodiment of the invention. FIG. 2 is a cross-sectional view taken along line II-II of FIG. 1. FIG. 3 is a cross-sectional view taken along line III-III of FIG. 1.

As shown in FIGS. 1 to 3, a solar cell 1 according to an example embodiment of the invention includes a substrate 110, an emitter layer 120 positioned at a light receiving surface of the substrate 110 on which light is incident, a plurality of first electrodes 141 positioned on the emitter layer 120, at least one first current collector 142 positioned on the emitter layer 120 in a direction crossing the plurality of first electrodes 141, an anti-reflection layer 130 positioned on the emitter layer 120 on which the plurality of first electrodes 141 and the at least one first current collector 142 are not positioned, and a second electrode 151 that is positioned on a surface opposite the light receiving surface of the substrate 110 and is connected to the substrate 110.

The substrate 110 is a semiconductor substrate formed of, for example, single crystal silicon of a first conductive type, for example, p-type, though not required. When the substrate 110 is of a p-type, the substrate 110 may be doped with impurities of a group III element such as boron (B), gallium (Ga), and indium (In). Alternatively, the substrate 110 may be an n-type. When the substrate 110 is of the n-type, the substrate 110 may be doped with impurities of a group V element such as phosphorus (P), arsenic (As), and antimony (Sb).

The surface of the substrate 110 may be textured to form a textured surface corresponding to an uneven surface or having uneven characteristics. If the surface of the substrate 110 is the textured surface, a light reflectance at the light receiving surface of the substrate 110 may be reduced. Further, because both a light incident operation and a light reflection operation may be performed on the textured surface of the substrate 110, light may be confined in the solar cell 1. Hence, a light absorption may increase, and the efficiency of the solar cell 1 may be improved. In addition, because a reflection loss of light incident on the substrate 110 may decrease, an amount of light incident on the substrate 110 may further increases.

The emitter layer 120 is a region doped with impurities of a second conductive type (for example, an n-type) opposite the first conductive type (for example, p-type) of the substrate 110. The emitter layer 120 forms a p-n junction along with the substrate 110. When the emitter layer 120 is of the n-type, the emitter layer 120 may be formed by doping the substrate 110 with impurities of a group V element such as phosphorus (P), arsenic (As), and antimony (Sb).

When energy produced by light incident on the substrate 110 is applied to electrons inside the substrate 110, electrons and holes are produced through the excitation of electrons. The electrons move to the n-type semiconductor, and the holes move to the p-type semiconductor. Thus, when the substrate 110 is of the p-type and the emitter layer 120 is of the n-type, the holes move to the p-type substrate 110 and the electrons move to the n-type emitter layer 120.

Unlike the embodiment of the invention, the substrate 110 may be of an n-type and may be formed of semiconductor materials other than silicon. When the substrate 110 is of the n-type, the substrate 110 may be doped with impurities of a group V element such as phosphorus (P), arsenic (As), and antimony (Sb).

Because the emitter layer 120 forms the p-n junction along with the substrate 110, the emitter layer 120 is of the p-type when the substrate 110 is of the n-type. In this instance, electrons move to the substrate 110 and holes move to the emitter layer 120. When the emitter layer 120 is of the p-type, the emitter layer 120 may be formed by doping the substrate 110 with impurities of a group III element such as boron (B), gallium (Ga), and indium (In).

The anti-reflection layer 130 on the emitter layer 120 may be formed of silicon nitride (SiNx) and/or silicon dioxide ($SiO_2$). The anti-reflection layer 130 reduces a reflectance of light incident on the solar cell 1 and increases selectivity of a predetermined wavelength band of the incident light, thereby increasing the efficiency of the solar cell 1.

FIGS. 1 to 3 show the anti-reflection layer 130 having a single-layered structure. However, the anti-reflection layer 130 may have a multi-layered structure such as a double-layered structure and a triple-layered structure. The anti-reflection layer 130 may be omitted, if desired.

Each of the plurality of first electrodes 141 includes a first electrode layer 141a, that is connected to the emitter layer 120 and is formed of a conductive material, and a second electrode layer 141b positioned on the first electrode layer 141a. Thus, carriers (for example, electrons) moving to the emitter layer 120 are mainly collected by the plurality of first electrode layers 141a, and at least a portion of the collected carriers move to the second electrode layers 141b connected to the first electrode layers 141a.

In the embodiment of the invention, the first electrode layer 141a contains silver (Ag) having the good conductivity, and the second electrode layer 141b is formed of the same material as the first electrode layer 141a. Further, a silver content of the second electrode layer 141b is less than a silver content of the first electrode layer 141a. For example, the silver content of the first electrode layer 141a may be about 80 wt % to 90 wt % with respect to the total weight, and the silver content of the second electrode layer 141b may be about 70 wt % to 75 wt % with respect to the total weight.

Alternatively, the silver content of the second electrode layer 141b may be substantially equal to the silver content of the first electrode layer 141a. The second electrode layer 141b may contain at least one selected from the group consisting of nickel (Ni), copper (Cu), aluminum (Al), tin (Sn), zinc (Zn), indium (In), titanium (Ti), gold (Au), and a combination thereof as a main component, instead of silver (Ag).

In the embodiment of the invention, because each of the plurality of first electrodes 141 has a double-layered structure including the first electrode layer 141a and the second electrode layer 141b, a thickness of the first electrode 141 having the double-layered structure is greater than a thickness of a first electrode having a single-layered structure. Hence, a serial resistance of the solar cell 1 is reduced, and a carrier transfer efficiency from the emitter layer 120 to the first electrodes 141 is improved. As a result, a current loss is reduced. Further, the silver content of the second electrode layer 141b may be less than the silver content of the first electrode layer 141a, and the second electrode layer 141b may be formed using a conductive material that is less expensive than silver. Therefore, the manufacturing cost of the solar cell 1 may be reduced.

As shown in FIGS. 1 to 3, a width of the second electrode layer 141b is less than a width of the first electrode layer 141a. In the solar cell 1 according to the example embodiment of the invention, a width W1 of the first electrode layer 141a may be approximately 30 μm to 100 μm, and a width W2 of the second electrode layer 141b may be approximately 25 μm to 45 μm. Further, a thickness T1 of the first electrode layer 141a may be approximately 10 μm to 35 μm, and a thickness T2 of the second electrode layer 141b may be approximately 3 μm to 15 μm.

When the width W1 of the first electrode layer 141a is less than approximately 30 μm, the disconnection of the first electrode 141 may be generated. When the width W1 of the first electrode layer 141a is greater than approximately 100 μm, a light receiving area of the solar cell 1 may decrease. Hence, the efficiency of the solar cell 1 may be reduced. Accordingly, it may be preferable, but not required, that the width W1 of the first electrode layer 141a is approximately 30 μm to 100 μm.

Further, when the second electrode layer 141b is manufactured to have the width W2 of approximately 25 μm to 45 μm less than the width W1 of the first electrode layer 141a, an amount of a paste or an ink used to form the second electrode layer 141b may decrease, and the manufacturing cost of the solar cell 1 may be reduced. Further, when the first electrode 141 is formed so that an upper part (i.e., the second electrode layer 141b) of the first electrode 141 is narrower than a lower part (i.e., the first electrode layer 141a) of the first electrode 141, the first electrode 141 having a high aspect ratio may be formed using a relatively small amount of material. Further, the receiving efficiency of light diagonally incident on the substrate 110 may be improved because of the above-described structure of the first electrode 141.

As shown in FIGS. 1 to 3, a cross-sectional shape of each of the first electrode layer 141a and the second electrode layer 141b is approximately a trapezoid shape in which both edges of an upper part thereof are round or curved. Alternatively, the cross-sectional shape of each of the first electrode layer 141a and the second electrode layer 141b may be a trapezoid shape in which both edges of an upper part thereof are angled. Alternatively, the cross-sectional shape of each of the first electrode layer 141a and the second electrode layer 141b may be a semioval shape or a semicircle shape. Other cross sectional shapes are possible.

The at least one first current collector 142 on the emitter layer 120 may be referred to as a bus bar. The at least one first current collector 142 extends in the direction crossing the plurality of first electrodes 141. Further, the at least one first current collector 142 is connected to the first and second electrode layers 141a and 141b. More specifically, the at least one first current collector 142 may be partially or portionally connected to the plurality of first electrode layers 141a and the plurality of second electrode layers 141b through the side of the at least one first current collector 142.

In the embodiment of the invention, the first current collector 142 is formed of the same material as the first electrode layers 141a and the second electrode layers 141b. Alternatively, the first current collector 142 may be formed of the same material as only the first electrode layers 141a, and the first current collector 142 may be formed of a material different from the second electrode layers 141b. When the first current collector 142 is formed of the same material as the first electrode layers 141a and the second electrode layers 141b, different amounts of the same material may be present.

In the embodiment of the invention, a thickness T3 of the first current collector 142 is substantially equal to a thickness (T1+T2) (i.e., a sum of the thickness T1 of the first electrode layer 141a and the thickness T2 of the second electrode layer 141b) of the first electrode 141. Alternatively, the thickness T3 of the first current collector 142 may be different from the thickness (T1+T2) of the first electrode 141. When the thickness T3 of the first current collector 142 is different from the thickness (T1+T2) of the first electrode 141, contact portions between the first electrodes 141 and the first current collector 142 may be inclined. In other embodiments, the contact portions between the first electrodes 141 and the first current collector 142 may be vertical. Additionally, when the thickness T3 of the first current collector 142 is different from the thickness (T1+T2) of the first electrode 141, the thickness T3 of the first current collector 142 may be the same as the thickness T1 of the first electrode layer 141a or the thickness T2 of the second electrode layer 141b.

As described above, each of the plurality of first electrodes 141 has the double-layered structure including the first electrode layer 141a and the second electrode layer 141b, and the first current collector 142 has a single-layered structure. Therefore, when the thickness T3 of the first current collector 142 is substantially equal to the thickness (T1+T2) of the first electrode 141, the thickness T2 of the second electrode layer 141b of the first electrode 141 is less than the thickness T3 of the first current collector 142.

Alternatively, as described above, the thickness T3 of the first current collector 142 may be different from the thickness (T1+T2) of the first electrode 141. In this instance, the thickness (T1+T2) of the first electrode 141 may be greater or less than the thickness T3 of the first current collector 142.

The plurality of first electrode layers 141a are spaced apart from one another and extend in a direction crossing the first current collector 142. Because the first current collector 142 extending in the direction crossing the plurality of first electrode layers 141a is positioned right on the emitter layer 120, the plurality of first electrode layers 141a are not positioned on the emitter layer 120 on which the first current collector 142 is positioned.

As above, because the first current collector 142 is connected to the plurality of first electrodes 141 and a portion of the emitter layer 120, the first current collector 142 outputs carriers (for example, electrons) transferred from the emitter layer 120 and the plurality of first electrodes 141 to an external device. In this instance, the first current collector 142 collects the carriers from the first electrode layers 141 a as well as the second electrode layers 141b.

The solar cell 1 further includes a back surface field (BSF) layer 171 between the second electrode 151 and the substrate 110. The back surface field layer 171 is a region (e.g., a $p^+$-type region) that is doped more heavily than the substrate 110 with impurities of the same conductive type as the substrate 110. The back surface field layer 171 serves as a potential barrier of the substrate 110. Thus, the back surface field layer 171 prevents or reduces a recombination and/or a disappearance of electrons and holes around the back surface opposite the light receiving surface of the substrate 110, thereby improving the efficiency of the solar cell 1.

The second electrode 151 on the back surface of the substrate 110 collects carriers (for example, holes) moving to the substrate 110. The second electrode 151 may be formed of at least one conductive material. The conductive material may be at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The solar cell 1 may further include at least one second current collector on the back surface of the substrate 110. The at least one second current collector may be connected to the second electrode 151. The at least one second current collector may be positioned opposite the at least one first current collector 142 with the substrate 110 interposed therebetween and may extend in the same direction as the first current collector 142. Other configurations may be used for the at least one second current collector.

The at least one second current collector may be formed of at least one conductive material. More specifically, the at least one second current collector may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used. The at least one second current collector may output carriers (for example, holes) transferred from the second electrode 151 to the external device A solar cell according to example embodiments of the invention is described below with reference to FIGS. 8 and 9.

Figure 8:
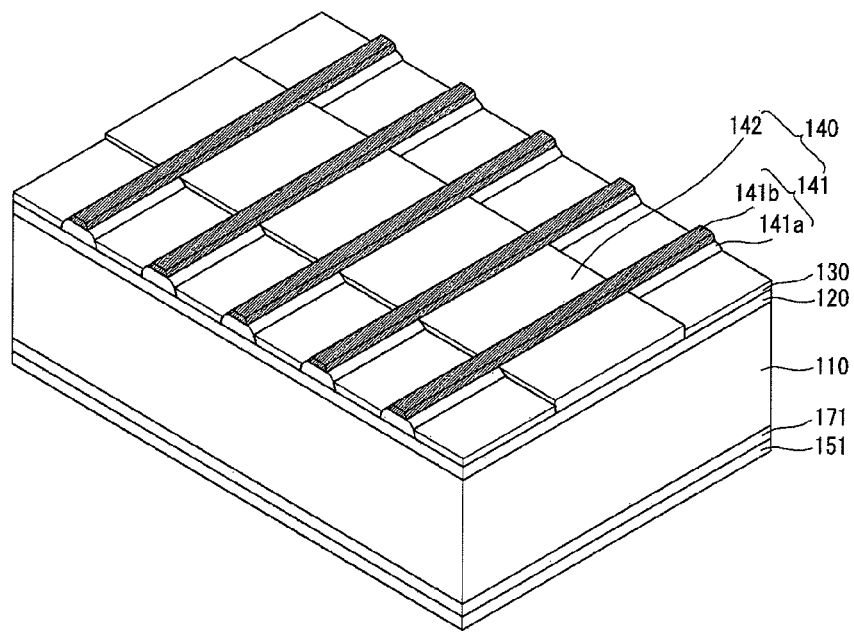
FIG. 8 is a partial perspective view of a solar cell according to another example embodiment of the invention.
Figure 9:
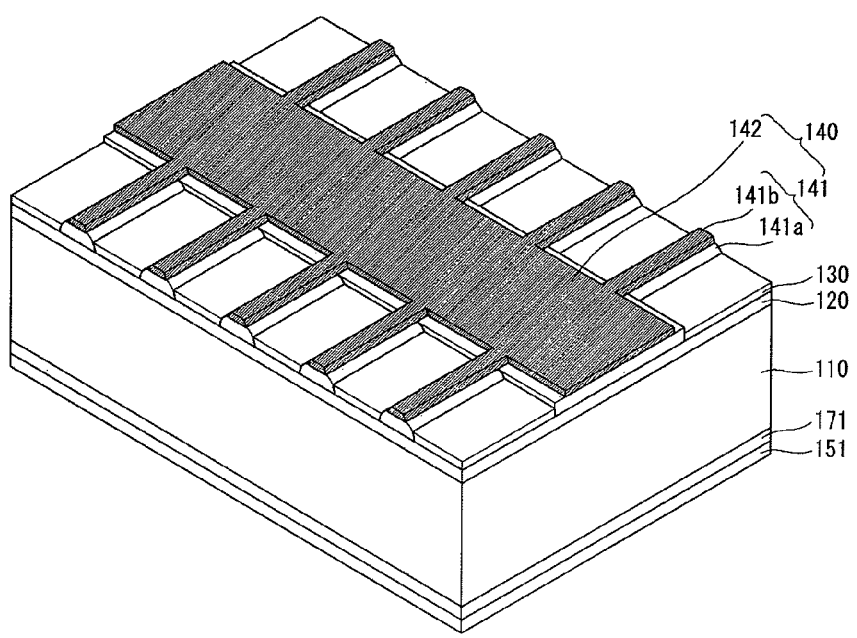
FIG. 9 is a partial perspective view of a solar cell according to yet another example embodiment of the invention.

FIG. 8 is a partial perspective view of a solar cell according to another example embodiment of the invention. FIG. 9 is a partial perspective view of a solar cell according to yet another example embodiment of the invention. Since configurations of solar cells shown in FIGS. 8 and 9 are substantially the same as the solar cell 1 shown in FIG. 1 except a first electrode part 140, a further description may be briefly made or may be entirely omitted.

First, as shown in FIG. 8, a plurality of second electrode layers 141b are positioned in a formation area of a plurality of first electrode layers 141a and at least one first current collector 142. More specifically, the plurality of second electrode layers 141b are positioned on the at least one first current collector 142. Each second electrode layer 141b on each first electrode layer 141a and each second electrode layer 141b on the at least one first current collector 142 form an integral body.

Accordingly, it may be understood that the first current collector 142 includes a first portion, that is positioned on an emitter layer 120 in a direction crossing a plurality of first electrodes 141 and has a rectangular shape, and a plurality of second portions that are positioned on the first portion and also are respectively formed on extension lines of the plurality of second electrode layers 141b. The plurality of second portions of the first current collector 142 are spaced apart from one another and extend in a direction crossing the first portion, i.e., in a direction parallel to the first electrodes 141. A width of the second portion is substantially equal to a width of the second electrode layer 141b.

In this instance, the first portion of the first current collector 142 is formed of the same material as the first electrode layers 141a, and the second portions of the first current collector 142 are formed of the same material as the second electrode layers 141b. The formation material of the first and second electrode layers 141a and 141b was described above with reference to FIGS. 1 to 3.

Next, as shown in FIG. 9, a shape of a second electrode layer 141b formed on at least one first current collector 142 may be substantially the same as the at least one first current collector 142. In other words, each of a plurality of first electrodes 141 may have the same plane shape as a first electrode layer 141a and the first current collector 142.

Accordingly, it may be understood that the first current collector 142 includes a plurality of layers, for example, a first layer, that is positioned on an emitter layer 120 in a direction crossing the first electrodes 141 and has a rectangular shape, and a second layer, that is positioned on the first layer in the direction crossing the first electrodes 141 and has a rectangular shape. A transverse length and a longitudinal length of the first layer of the first current collector 142 are greater than a transverse length and a longitudinal length of the second layer of the first current collector 142, respectively. Alternatively, the transverse length and the longitudinal length of the first layer of the first current collector 142 may be substantially equal to the transverse length and the longitudinal length of the second layer of the first current collector 142, respectively.

In this instance, the first layer of the first current collector 142 is formed of the same material as the first electrode layers 141*a*, and the second layer of the first current collector 142 is formed of the same material as the second electrode layers 141*b*. The formation material of the first and second electrode layers 141*a* and 141*b* was described above with reference to FIGS. 1 to 3.

A method for manufacturing the solar cell 1 according to the embodiment of the invention is described with reference to FIGS. 4(*a*)-4(*e*) and FIGS. 5-7.

FIGS. 4(*a*) to 4(*e*) are cross-sectional views sequentially illustrating a method for manufacturing a solar cell according to an example embodiment of the invention. FIG. 5 is a cross-sectional view of FIG. 4(*c*) in a direction crossing a first electrode. FIG. 6 is a cross-sectional view of FIG. 4(*d*) in a direction crossing a first electrode. FIGS. 7(*a*) to 7(*b*) illustrate various patterns of a front electrode part printed on a substrate according to example embodiments of the invention. More specifically, FIG. 7(*a*) illustrates a first printed pattern of a front electrode part formed using a screen printing method, and FIGS. 7(*b*) to 7(*d*) illustrate a second printed pattern of a front electrode part formed using a roll printing method.

As shown in FIG. 4(*a*), a high temperature thermal process of a material (for example, POCl$_3$ or H$_3$PO$_4$) containing impurities of a group V element such as phosphorus (P), arsenic (As), and antimony (Sb) may be performed on the p-type substrate 110 to distribute the impurities of the group V element into the substrate 110. Hence, the n-type emitter layer 120 may be formed at the entire surface of the substrate 110 including a front surface, a back surface, and lateral surfaces of the substrate 110.

Alternatively, when the substrate 110 is of an n-type unlike the embodiment of the invention, a high temperature thermal process of a material (for example, B$_2$H$_6$) containing impurities of a group III element may be performed on the substrate 110 to form the p-type emitter layer 120 at the entire surface of the substrate 110. Subsequently, phosphorous silicate glass (PSG) containing phosphorous (P) or boron silicate glass (BSG) containing boron (B) produced when p-type impurities or n-type impurities are distributed into the substrate 110 is removed through an etching process.

Next, as shown in FIG. 4(*b*), the anti-reflection layer 130 is formed by depositing silicon nitride (SiNx) on the light receiving surface (for example, the front surface) of the substrate 110 using various deposition methods, for example, a plasma enhanced chemical vapor deposition (PECVD) method.

A refractive index of the anti-reflection layer 130 may have a value between a refractive index (=1) of air and a refractive index (=3.5, for example) of the silicon substrate 110. For example, the anti-reflection layer 130 may have the refractive index of about 1.9 to 2.3. Hence, because the refractive indexes going from air to the substrate 110 via the anti-reflection layer 130 sequentially change, the anti-reflection effect of the anti-reflection layer 130 is improved.

Figure 4A:
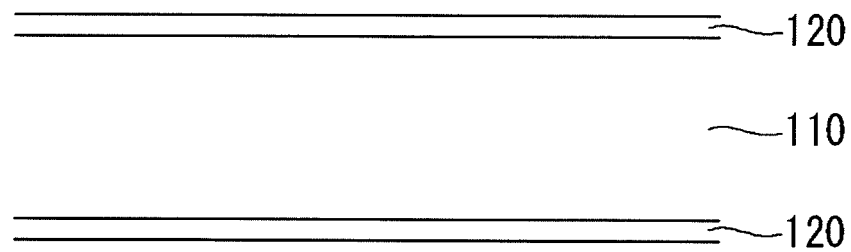
FIGS. 4(a) to 4(e) are cross-sectional views sequentially illustrating a method for manufacturing a solar cell according to an example embodiment of the invention.
Figure 4B:
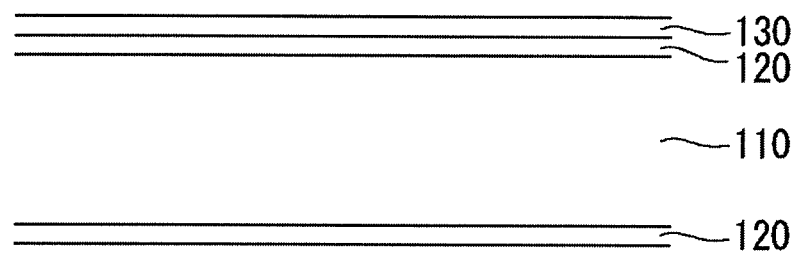
Figure 4C:
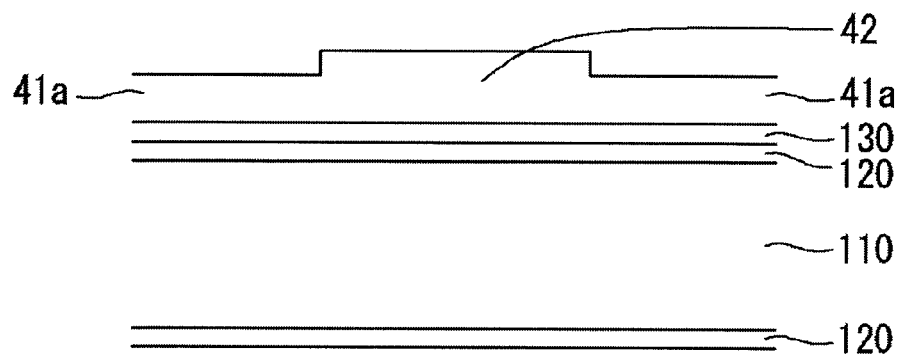
Figure 4D:
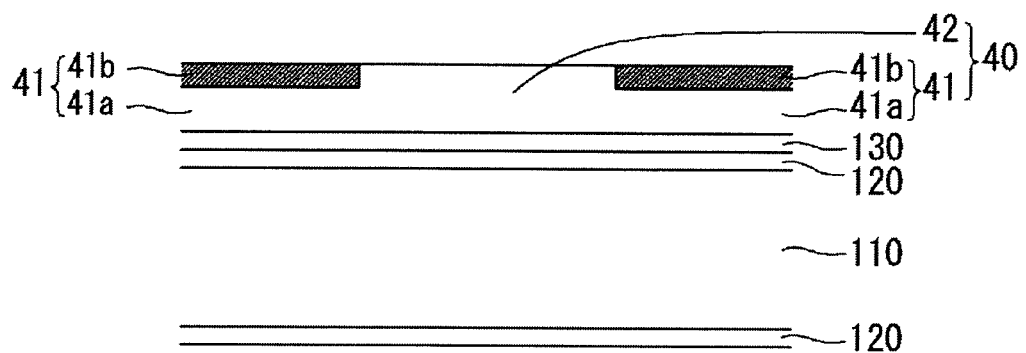
Figure 4E:
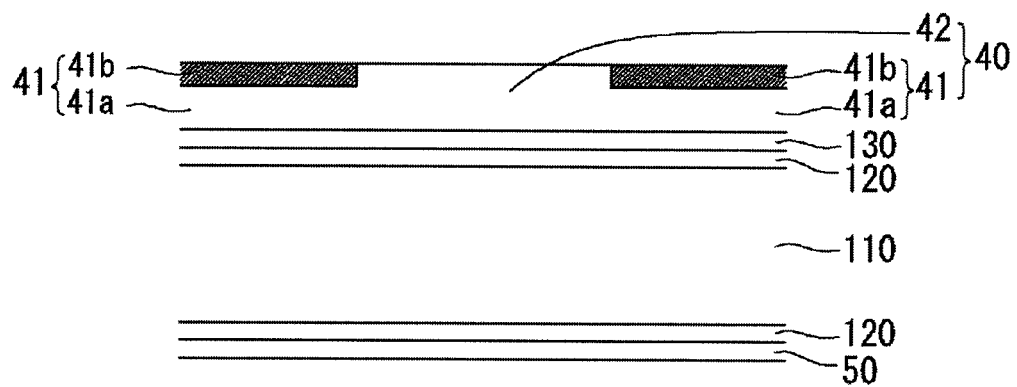
Figure 5:
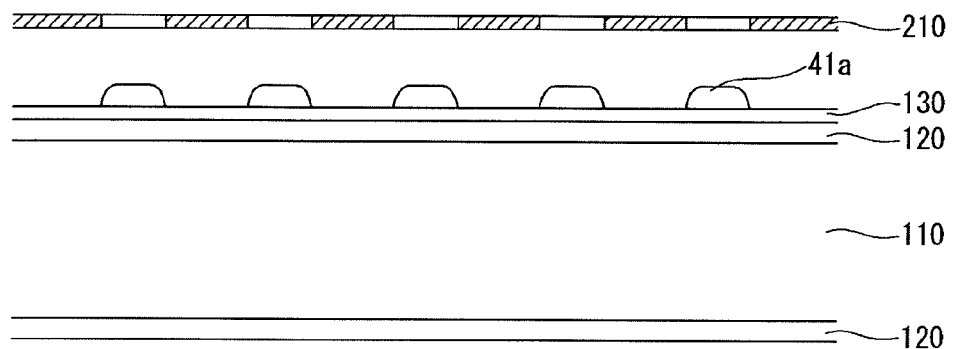
FIG. 5 is a cross-sectional view of FIG. 4(c) in a direction crossing a first electrode.

Next, as shown in FIG. 4(*c*) and FIG. 5, a silver-containing paste is formed or printed on a desired portion of the anti-reflection layer 130 by using a method, such as the screen printing method and then is dried at a temperature of about 120° C. to 200° C. to form a first front electrode part pattern 40*a*. A shape of the first front electrode part pattern 40*a* is shown in FIG. 7(*a*). The first front electrode part pattern 40*a* includes a first electrode layer pattern 41*a* and a first current collector pattern 42. In FIG. 5, a reference numeral 210 denotes a screen mask used when the first front electrode part pattern 40*a* is formed using the screen printing method.

The first current collector pattern 42 extends in a direction crossing the first electrode layer pattern 41*a*. When the first front electrode part pattern 40*a* is formed using a silver paste, a contact resistance between the first front electrode part pattern 40*a* and the substrate 110 decreases. Hence, photoelectric conversion characteristic of the solar cell 1 may be improved.

Figure 6:
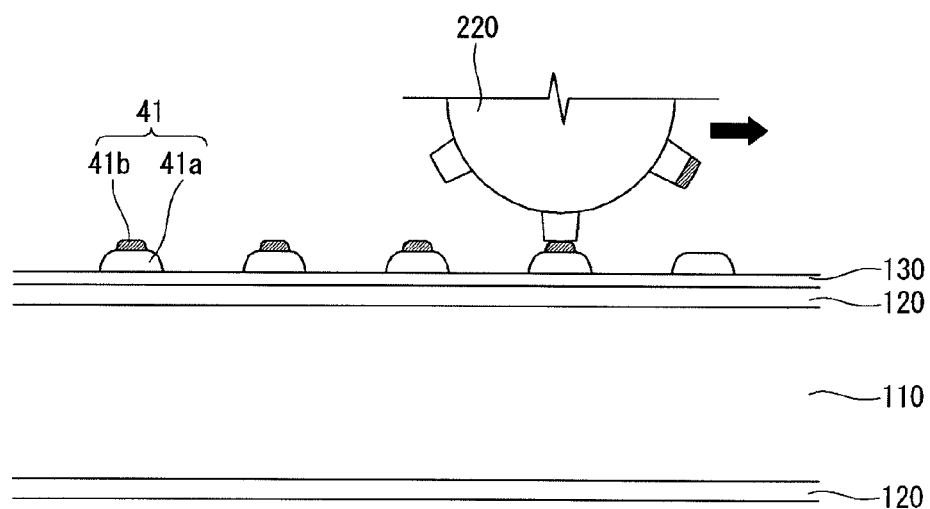
FIG. 6 is a cross-sectional view of FIG. 4(d) in a direction crossing a first electrode.

Next, as shown in FIG. 4(*d*) and FIG. 6, a silver-containing ink is printed on the first front electrode part pattern 40*a* using the roll printing method and then is dried to form a second front electrode part pattern 40*b*. In FIG. 6, a reference numeral 220 denotes a roll used when the second front electrode part pattern 40*b* is formed using the roll printing method.

The roll printing method is a direct contact printing method. Further, examples of the roll printing method include a gravure printing method, a flexo printing method, an offset printing method, and a gravure/offset printing method. The gravure printing method is a printing method for applying an ink to a cylinder provided with an intaglio pattern and transferring the ink to a substrate. The flexo printing method is a printing method for applying an ink to an embossed pattern and stamping the embossed pattern like a seal. The offset printing method is a printing method for transferring an ink to a blanket cylinder and again transferring the ink transferred to the blanket cylinder to a substrate or another surface. The gravure/offset printing method is a printing method for transferring an ink from a printing plate to a blanket and again transferring the ink transferred to the blanket to a substrate or another substrate. Further, the gravure/offset printing method is a printing method for replacing a printing plate of the offset printing method by a printing plate of the gravure printing method.

The embodiment of the invention of FIG. 6 uses the offset roll printing method. In the offset roll printing method, a groove is formed at a predetermined location of an intaglio printing plate corresponding to the second front electrode part pattern 40*b*, that will be formed on the substrate 110, and then is filled with a second front electrode ink. The second front electrode ink filled in the groove is transferred to the surface of a rotating blanket. Next, the second front electrode ink transferred to the blanket is again transferred to the substrate 110 (or to the first front electrode part pattern 40*a* or the first electrode layer pattern 41*a*) by rotating the blanket in a state where the blanket contacts the substrate 110 (or the first front electrode part pattern 40*a* or the first electrode layer pattern 41*a*). The second front electrode ink retransferred to the substrate 110 (or the first front electrode part pattern 40*a* or the first electrode layer pattern 41*a*) is then dried to form the second front electrode part pattern 40*b*.

Alternatively, the process for transferring the second front electrode ink to the blanket may be omitted. More specifically, a groove is formed at a predetermined location of an intaglio printing plate corresponding to the second front electrode part pattern 40*b*, that will be formed on the substrate 110, and then is filled with a second front electrode ink. Next, the roll-shaped intaglio printing plate filled with the second front electrode ink directly contacts the substrate 110 (or the first front electrode part pattern 40*a* or the first electrode layer pattern 41*a*). Hence, the second front electrode ink is transferred to a predetermined location of the substrate 110 (or the first front electrode part pattern 40*a* or the first electrode layer pattern 41*a*). The second front electrode ink transferred to the substrate 110 (or the first front electrode part pattern 40a or the first electrode layer pattern 41a) is then dried to form the second front electrode part pattern 40b.

The second front electrode part pattern 40b may be formed using the gravure printing method, the flexo printing method, and the gravure/offset printing method, instead of the offset roll printing method.

In the embodiment of the invention, a conductive ink used to form the second front electrode part pattern 40b contains silver. A silver content of the conductive ink is about 10 wt % to 70 wt % with respect to the total weight, and a viscosity of the conductive ink is about 300 cP to 1000 cP.

In the embodiment of the invention, a silver content of the second front electrode ink used to form the second front electrode part pattern 40b is less than a silver content of the paste used to form the first front electrode part pattern 40a.

In other words, a paste, in which an amount of a silver (or silver powder) is relatively high with respect to the total weight, may be printed on the anti-reflection layer 130 to form the first front electrode part pattern 40a. Then, an ink, in which an amount of a silver (or silver powder) is less than the amount of the silver (or silver powder) of the paste used to form the first front electrode part pattern 40a with respect to the total weight, may be printed on the first front electrode part pattern 40a to form the second front electrode part pattern 40b.

Alternatively, the silver content of the second front electrode ink used to form the second front electrode part pattern 40b may be substantially equal to the silver content of the paste used to form the first front electrode part pattern 40a. The second front electrode ink used to form the second front electrode part pattern 40b may contain other conductive materials instead of silver. In various embodiments, the silver content of the second front electrode ink used to form the second front electrode part pattern 40b may be different to the silver content of the paste used to form the first front electrode part pattern 40a, either in portions of the respective patterns or as a whole.

In the embodiment of the invention, as shown in FIG. 6, a width of the first electrode layer pattern 41a is greater than a width of a second electrode layer pattern 41b.

Figure 7A:
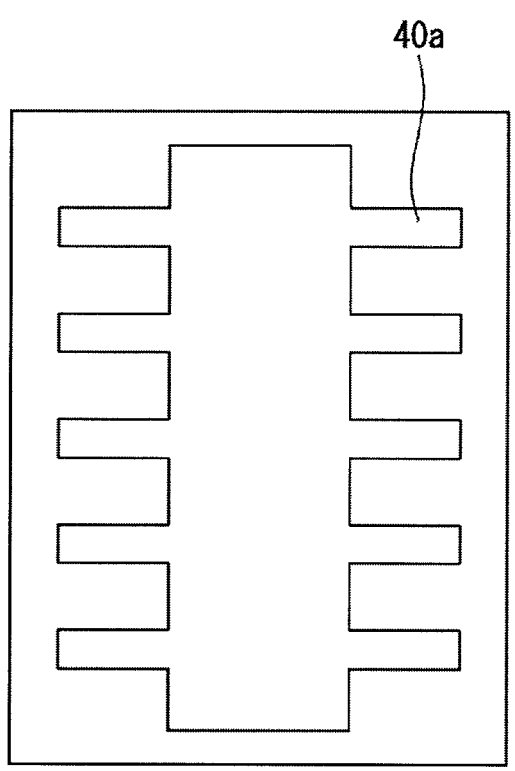
FIGS. 7(a) to 7(d) illustrate various patterns of a front electrode part printed on a substrate according to an example embodiment of the invention.
Figure 7B:
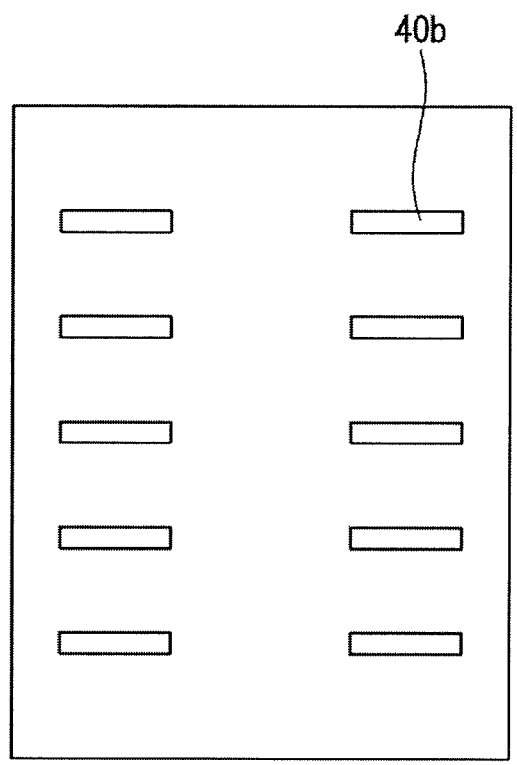
Figure 7C:
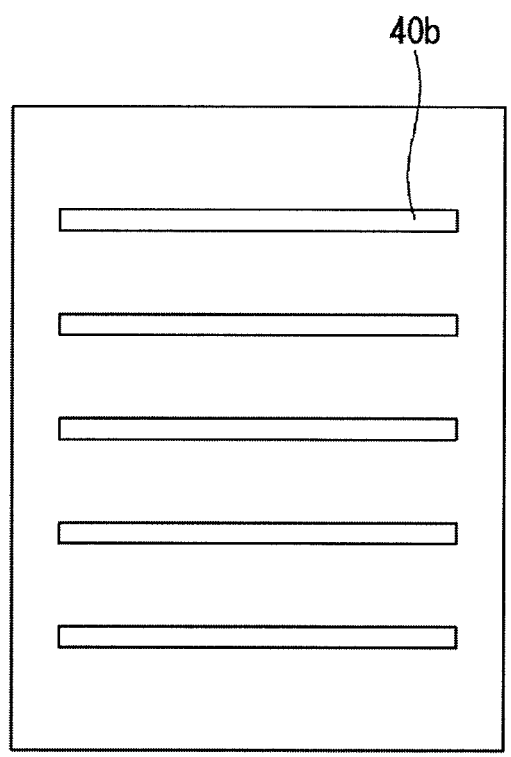
Figure 7D:
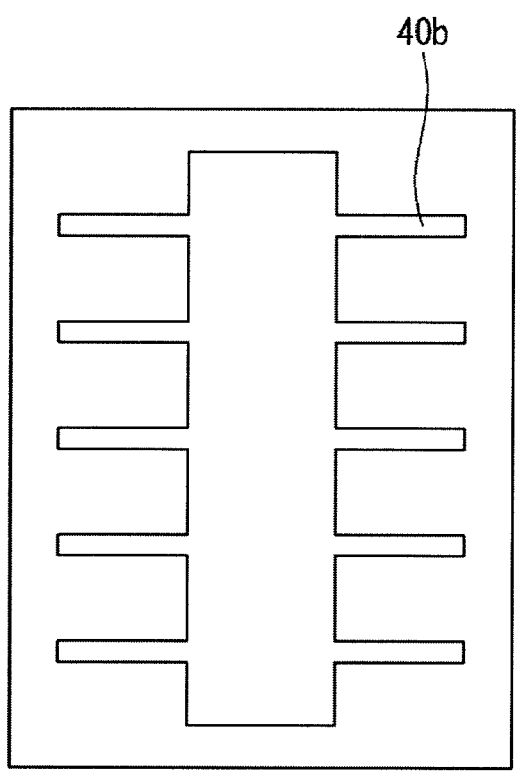

In the embodiment of the invention, one shape of the second front electrode part pattern 40b printed on the substrate 110 is shown in FIG. 7(b). Alternatively, as shown in FIG. 7(c), the second front electrode part pattern 40b may be continuously printed without a discontinuity on a formation area of the first current collector pattern 42. Alternatively, as shown in FIG. 7(d), the second front electrode part pattern 40b may be printed in the same shape as the first front electrode part pattern 40a.

In the embodiment of the invention, as shown in FIG. 4(d), a thickness of the first current collector pattern 42 is substantially equal to a thickness of a first electrode pattern 41. Alternatively, the thickness of the first current collector pattern 42 may be different from the thickness of the first electrode pattern 41.

Next, as shown in FIG. 4(e), a back electrode paste containing aluminum (Al) or a silver-containing ink, for example, is applied to a corresponding portion of the back surface of the substrate 110 using the screen printing method or the roll printing method and then is dried to form a back electrode pattern 50.

The back electrode paste may contain at least one selected from the group consisting of silver (Ag), nickel (Ni), copper (Cu), tin (Sn), zinc (Zn), indium (In), titanium (Ti), gold (Au), and a combination thereof, instead of aluminum (Al). Other materials are also possible.

In the embodiment of the invention, a formation order of a front electrode part pattern 40 including the first electrode pattern 41 and the first current collector pattern 42 and the back electrode part pattern 50 may vary.

Subsequently, the substrate 110 including the front electrode part pattern 40 and the back electrode part pattern 50 is fired (or subject to a thermal process) at about 750° C. to 800° C. to form the plurality of first electrodes 141, at least one first current collector 142, the second electrode 151, and the back surface field layer 171.

More specifically, when a thermal process is performed, the front electrode part pattern 40 passes through the anti-reflection layer 130 underlying the front electrode part pattern 40 due to an element such as lead (Pb) contained in a glass frit of the front electrode part pattern 40. Hence, the plurality of first electrodes 141 and the at least one first current collector 142 contacting the emitter layer 120 are formed to complete a front electrode part 140. In this instance, the first electrode pattern 41 of the front electrode part pattern 40 forms the plurality of front electrodes, i.e., the plurality of first electrodes 141, and the first current collector pattern 42 of the front electrode part pattern 40 forms the at least one first current collector 142.

Further, the back electrode pattern 50 forms the second electrode 151 connected to the substrate 110 in the thermal process. Aluminum (Al) contained in the second electrode 151 is distributed into the substrate 110 contacting the second electrode 151 to form the back surface field layer 171 between the second electrode 151 and the substrate 110. In other words, aluminum (Al) contained in the second electrode 151 passes through the emitter layer 120 positioned at the back surface of the substrate 110 and is distributed into the back surface of the substrate 110 to form the back surface field layer 171.

Next, an edge isolation process for removing at least a portion of the emitter layer 120 formed at the side or edges of the substrate 110 is performed using, for example, a laser beam. Hence, the emitter layer 120 positioned at the front surface of the substrate 110 is electrically separated from the emitter layer 120 positioned at the back surface of the substrate 110. Finally, the solar cell 1 shown in FIGS. 1 and 2 is completed.

In embodiments of the invention, an ink, such as the second front electrode part ink, is a fluid substance and a paste, such as the first front electrode part paste, is a pliable substance. The ink and the paste have different viscosities. For example, the paste is more viscous than ink.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A method for manufacturing an electrode of a solar cell, the method comprising:
printing a first front electrode part paste on a semiconductor substrate using a screen printing method to form a first front electrode part pattern; and printing a second front electrode part ink on the first front electrode part pattern using a roll printing method to form a second front electrode part pattern, wherein the forming of the first front electrode part pattern includes simultaneously forming a first electrode layer pattern in a first direction and a first current collector pattern, which has a greater height than a height of the first electrode layer pattern, in a second direction crossing the first direction, wherein the forming of the second front electrode part pattern includes printing the second front electrode part ink on the first electrode layer pattern to form a second electrode layer pattern on the first electrode layer pattern in the first direction, and wherein an added height of the first electrode layer pattern and the second front electrode part pattern is equal to or greater than the height of the first current collector pattern.

2. The method of claim 1, wherein in the forming of the second front electrode part pattern, a width of the second electrode layer pattern is less than a width of the first electrode layer pattern.

3. The method of claim 1, wherein the forming of the second front electrode part pattern includes printing the second front electrode part ink on the first electrode layer pattern and the first current collector pattern to form a second electrode layer pattern having the same plane shape as the first front electrode part pattern.

4. The method of claim 3, wherein in the forming of the second front electrode part pattern, a width of the second electrode layer pattern is less than a width of the first electrode layer pattern and a width of the first current collector pattern.

5. The method of claim 1, wherein the forming of the second front electrode part pattern includes:
   filling the second front electrode part ink in a groove of an intaglio printing plate corresponding to a formation location of the second front electrode part pattern to be formed; and
   bringing the intaglio printing plate having a roll shape into contact with the at least a portion of the first front electrode part pattern on the semiconductor substrate and rotating the intaglio printing plate to transfer the second front electrode part ink filled in the groove of the intaglio printing plate to the at least a portion of the first front electrode part pattern on a surface of the semiconductor substrate.

6. The method of claim 1, wherein the forming of the second front electrode part pattern includes:
   filling the second front electrode part ink in a groove of an intaglio printing plate corresponding to a formation location of the second front electrode part pattern to be formed;
   bringing the intaglio printing plate into contact with a roll-shaped blanket and rotating the intaglio printing plate to transfer the second front electrode part ink filled in the groove of the intaglio printing plate to a surface of the roll-shaped blanket; and
   bringing the blanket into contact with the at least a portion of the first front electrode part pattern on semiconductor substrate and rotating the blanket to again transfer the second front electrode part ink transferred to the blanket to the at least a portion of the first front electrode part pattern on a surface of the semiconductor substrate.

7. The method of claim 1, wherein the first front electrode part paste and the second front electrode part ink contain silver (Ag).

8. The method of claim 1, wherein a silver (Ag) content of the first front electrode part paste is greater than a silver (Agconvent content of the second front electrode part ink.

9. The method of claim 1, further comprising, before forming the second front electrode part pattern, drying the first front electrode part pattern.

10. The method of claim 1, further comprising simultaneously firing the first front electrode part pattern and the second front electrode part pattern.

* * * * *